US009197220B2

(12) United States Patent
Hayashi et al.

(10) Patent No.: US 9,197,220 B2
(45) Date of Patent: Nov. 24, 2015

(54) METHOD FOR RESETTING PHOTOELECTRIC CONVERSION DEVICE, AND PHOTOELECTRIC CONVERSION DEVICE

(71) Applicants: National Institute of Advanced Industrial Science and Technology, Tokyo (JP); RICOH COMPANY, LTD., Tokyo (JP)

(72) Inventors: Yutaka Hayashi, Ibaraki (JP); Toshitaka Ota, Ibaraki (JP); Yasushi Nagamune, Ibaraki (JP); Hirofumi Watanabe, Hyogo (JP); Takaaki Negoro, Osaka (JP); Kazunari Kimino, Hyogo (JP)

(73) Assignees: National Institute of Advanced Industrial Science and Technology, Tokyo (JP); RICOH COMPANY, LTD., Tokyo (JP)

( * ) Notice: Subject to any disclaimer, the term of this patent is extended or adjusted under 35 U.S.C. 154(b) by 457 days.

(21) Appl. No.: 13/665,037

(22) Filed: Oct. 31, 2012

(65) Prior Publication Data

US 2013/0127504 A1 May 23, 2013

(30) Foreign Application Priority Data

Oct. 31, 2011 (JP) ................................ 2011-239187

(51) Int. Cl.
*H01L 31/062* (2012.01)
*H03L 3/00* (2006.01)
*H01L 27/146* (2006.01)

(52) U.S. Cl.
CPC ............ *H03L 3/00* (2013.01); *H01L 27/14612* (2013.01); *H01L 27/14681* (2013.01); *H01L 31/062* (2013.01); *H01L 27/1461* (2013.01)

(58) Field of Classification Search
CPC ..................... H01L 27/14681; H01L 27/1461; H01L 27/14612; H01L 31/062; H01L 3/00
USPC .................. 250/208.1; 257/290–292; 327/142
See application file for complete search history.

(56) References Cited

U.S. PATENT DOCUMENTS

| 5,101,252 A | 3/1992 | Matsumoto |
| 5,146,339 A | 9/1992 | Shinohara et al. |

(Continued)

FOREIGN PATENT DOCUMENTS

| EP | 0327344 A2 | 8/1989 |
| EP | 0433007 A1 | 6/1991 |

(Continued)

OTHER PUBLICATIONS

European Search Report dated May 15, 2013 in corresponding European patent application No. 12 19 0760.4.

*Primary Examiner* — Seung C Sohn
(74) *Attorney, Agent, or Firm* — Cooper & Dunham LLP (57) ABSTRACT

A reset method of an photoelectric conversion device at least including a phototransistor having a first collector, a first base, and a first emitter, and a first field-effect transistor having a first source, a first drain, and a first gate, includes: connecting the first base, and one of the first source and the first drain of the first field-effect transistor by having a common region, or a continuous region, without a base electrode; supplying a base reset potential to the other of the first source and the first drain; and overlapping a time in which a first emitter potential is supplied to the first emitter and a time in which a first ON-potential that turns on the first field-effect transistor is supplied to the first gate.

12 Claims, 3 Drawing Sheets

(56) References Cited

U.S. PATENT DOCUMENTS

| | | |
|---|---|---|
| 5,288,988 A | 2/1994 | Hashimoto et al. |
| 2010/0320517 A1* | 12/2010 | Okagawa ..................... 257/292 |
| 2011/0134264 A1* | 6/2011 | Nishihara et al. .......... 348/222.1 |
| 2012/0085888 A1* | 4/2012 | Endo et al. ................. 250/208.1 |
| 2013/0119240 A1* | 5/2013 | Hayashi et al. ............ 250/208.1 |

FOREIGN PATENT DOCUMENTS

| | | |
|---|---|---|
| JP | S47-18561 | 5/1972 |
| JP | 63-175467 | 7/1988 |
| JP | H1-198183 A | 8/1989 |
| JP | H2-296457 A | 12/1990 |

* cited by examiner

METHOD FOR RESETTING PHOTOELECTRIC CONVERSION DEVICE, AND PHOTOELECTRIC CONVERSION DEVICE

CROSS-REFERENCE TO RELATED APPLICATIONS

The present application is based on and claims priority from Japanese Patent Application number 2011-239187, filed Oct. 31, 2011, the disclosure of which is hereby incorporated by reference herein in its entirety.

BACKGROUND

The present invention relates to a photoelectric conversion device that converts optical information such as light intensity, light wavelength, and the like, and an optical image into electronic information including current or voltage, or digital data. In particular, the present invention relates to a photoelectric conversion device having improved performance. Additionally, the present invention relates to a photoelectric conversion cell to which the present invention is applied, a photoelectric conversion array including an array architecture of the photoelectric cell, and an imaging device including the photoelectric conversion array.

In the technology utilized by the present invention where a base of a phototransistor is in an electrically floating state, and a photocurrent flowing through the base of the phototransistor is accumulated for a certain period of time, and is read out as an electric signal, in a case where a potential or charge accumulated in the base is not completely drawn out at the time of reading out, it is necessary to reset a residual potential or charge in the base after reading out (return to an initial state). In a case where the phototransistor is used as a component of an imaging device, the residual potential or charge adversely affects an imaging process.

Japanese Patent Application Publication number H01-198183 discloses an electrode provided in a base of a phototransistor, and a method for resetting a base potential to a constant value through the base electrode after reading out. Additionally, Japanese Patent Application Publication number H01-198183 discloses that an output linearity with respect to an exposure amount is improved by making a reset potential of an emitter or a base closer to a collector potential than a reset potential of a signal line.

However, when choosing a reset potential closer to a collector potential so as to obtain output even when an exposure amount is zero, there is a problem such that it is not possible to obtain sensitivity with respect to a small amount of light because there is a baseline output. On the other hand, when a reset potential is far from a collector potential, and output is not obtained when an exposure amount is zero or small, it is not possible to obtain output with respect to the small amount of light. Japanese Patent Application Publication number H01-198183 also indicates the latter problem; however, specific knowledge regarding an optimal reset potential is not disclosed. In addition, although setting of not an absolute value of a base potential, but a base-emitter voltage is essential, a method for resetting a base-emitter voltage, and specific knowledge regarding an optimal base-emitter voltage are not disclosed either.

Furthermore, due to the above reset mechanism, there is a problem such that a necessary switch circuit and interconnections necessarily increase an area of a photoelectric conversion device. Additionally, there is also a problem such that providing a base electrode disclosed in Japanese Patent Application Publication number H01-198183 causes an increase of a dark current, reduces efficiency by forming a shadow on a light-illuminated surface of a phototransistor, and increases the area of the photoelectric conversion device.

On the other hand, in a case where a base of a phototransistor is in an electrically floating state, and a capacitance (a base-collector junction capacitance, a base floating capacitance, etc.) connected to the base is charged and discharged by a photocurrent flowing through a base-collector junction of the phototransistor for a certain period of time, and a change of an accumulated electric charge quantity is read out as an electric signal, when the light intensity is large with respect to an accumulation time (equivalent to the certain period of time, and also referred to as an integration time), a change of voltage of the capacitance connected to the base becomes too large, the photocurrent flows through the base-collector junction in the forward direction, the base-collector junction is deeply biased to a deep forward voltage, and in each region of two opposite-conductivity-type semiconductors constituting the base-collector junction, excess minority carriers are stored. Therefore, when switching the base-collector junction in a reverse-biased direction, there is a problem such that the time taken to switch in the reverse-biased direction is delayed during a time called "a saturation time" related to a minority carrier lifetime, and a response speed is affected. This phenomenon is called a "saturation phenomenon".

As a saturation control technique, a technique to prevent a base-collector junction from being deeply biased to a deep forward voltage, namely, a technique where a Schottky junction is connected in parallel to the base-collector junction is known (see Japanese Patent Publication number S47-18561). Compared to cases where the same current flows through the base-collector junction and the Schottky junction, a forward voltage is smaller in the case of the Schottky junction, and therefore most current flows not through the base-collector junction but through the Schhottky junction which is connected in parallel, and thus it is possible to prevent the base-collector junction from being deeply forward biased. However, a reverse current of the Schottky junction is orders of magnitude larger than that of the base-collector junction; therefore, an overall dark current as a photoelectric conversion element increases, and it is unusable for a high-sensitivity photoelectric conversion device.

The objects of the present invention are: 1. provision of a method of setting a base-emitter reset voltage and an optimal voltage for the base-emitter reset; 2. removal of a base electrode; and 3. provision of a saturation control method utilizing a switch circuit and interconnections that are used for a reset function with increase in an area of a photoelectric conversion device.

The saturation control technique prevents a saturation state where a base-collector junction is "deeply biased to a deep forward voltage"; however, that is a technique where a reverse current of the base-collector junction does not become as large as that of the Schottky junction.

Note that in the present invention, "deeply biased to a forward voltage" or "deeply biased to a deep forward voltage" means that a state of a forward voltage of a base-collector junction when a photocurrent flows to the forward direction all through the base-collector junction, for example, in a state where only equal to or less than $1/10$ of the photocurrent flows, a saturation time is improved to about $1/10$; therefore, it is considered that a problem has been solved. A forward voltage of the base-collector junction in that case is smaller than a state of "deeply biased to the deep forward voltage" by only 2.3 kT/q (=about 60 mV at a normal temperature). In the present invention, "a saturation control" is that in a circumstance where a PN junction is deeply biased to a deep forward voltage when being left, the base-collector junction is controlled in a forward-biased state smaller by only 2.3 kT/q than the deep forward voltage state, or the base-collector junction is kept in a zero-biased state, or in a reverse-biased state. Here, k denotes Boltzmann constant, T denotes an absolute temperature of the photoelectric conversion device, and q denotes elementary charge of an electron.

In a case where the base-collector junction is formed by providing a second semiconductor region of an opposite conductivity type in contact with a first semiconductor region of a first conductivity type, those stored excess minority carriers spread from a position of the base-collector junction within a range of a minority carrier diffusion length in the first semiconductor region. Likewise, also in the second semiconductor region, those stored excess minority carriers spread from the base-collector junction within the range of minority carrier diffusion length. Note that the minority carrier diffusion length is different from carrier types (electron or hole), and an electric characteristic of a semiconductor region. Therefore, values of the diffusion length are different between the first semiconductor region and the second semiconductor region.

Furthermore, when another base-collector junction having a photoelectric conversion function is provided at a distance of the diffusion length, electric current flows through the other base-collector junction even though light does not illuminate the other base-collector junction, and malfunction occurs as if light illuminated a position of the other base-collector junction. In a case where in the first semiconductor region, many photoelectric conversion elements such as a base-collector junction having a photoelectric conversion function are arranged, and a photoelectric conversion element array is formed, and an imaging device is made, an image blur occurs and resolution declines equivalently, and as a result, the above problem occurs.

One of objects of the present invention is to improve an image blur and equivalent deterioration of the resolution by effectively utilizing a switch circuit and interconnections that are provided for the reset function but increase an area of the photoelectric conversion device.

Note that storage of excess minority carriers (electric charges) causing saturation, and charging and discharging of a base capacitance by a photocurrent as electronic information (for example, base-collector junction capacitance Cbc, base-emitter junction capacitance Cbe, base-ground capacitance Cbst) are different phenomena. In the present invention, a change of a charge amount of the base capacitance occurring as a result of charging or discharging of the base capacitance by the photocurrent is called "accumulation charge by light".

SUMMARY

In order to achieve the above object, an embodiment of the present invention provides: a reset method of a photoelectric conversion device at least including a phototransistor having a first collector, a first base, and a first emitter, and a first field-effect transistor having a first source, a first drain, and a first gate, comprising: connecting the first base, and one of the first source and the first drain of the first field-effect transistor by having a common region, or a continuous region, without a base electrode; supplying a base reset potential to the other of the first source and the first drain; and overlapping a time in which a first emitter potential is supplied to the first emitter and a time in which a first ON-potential that turns on the first field-effect transistor is supplied to the first gate.

Additionally, in order to achieve the above object, an embodiment of the present invention provides: a photoelectric conversion device comprising: a first semiconductor region of a first conductivity type; a second semiconductor region of an opposite conductivity type opposite to the first conductivity type that is in contact with the first semiconductor region; a third semiconductor region of the opposite conductivity type that is separate from the second semiconductor region, and is in contact with the first semiconductor region; a fifth semiconductor region of the first conductivity type that is in contact with the second semiconductor region; a first insulating film that is provided on at least a surface of the first semiconductor region; and a first gate that is provided on the first insulating film, wherein the second semiconductor region, or the first semiconductor region in a vicinity of the second semiconductor region is illuminated by light, and a photocurrent flows between the second semiconductor region and the first semiconductor region, and a time in which a first emitter potential is supplied to the fifth semiconductor region overlap with a time in which a base reset potential is supplied to the third semiconductor region and a first gate potential that induces a channel or a current path on the surface of the first semiconductor region under the first gate is supplied to the first gate.

Furthermore, in order to achieve the above object, an embodiment of the present invention provides: a photoelectric conversion device at least comprising: a phototransistor having a first collector, a first base, and a first emitter; a first field-effect transistor having a first source, a first drain, and a first gate; wherein the first base and the first source of the first field-effect transistor are connected without a base electrode by having a common region, or a continuous region, and after a base reset potential is supplied to the first drain, a first emitter potential is supplied to the first emitter, and then a first ON-potential that turns on the first field-effect transistor is supplied to the first gate, a saturation control potential is supplied to the first gate, and a first drain potential is supplied to the first drain.

DETAILED DESCRIPTION OF THE PREFERRED EMBODIMENTS

The present invention provides the following modes (1) to (25) to solve the above-described problems.

By having a period of time to reset a base potential and an emitter potential at the same time, as a method of resetting a base-emitter potential to an intended value, the following method is provided. Additionally, a method of improving reduction of light-electronic information conversion efficiency due to an increase of a dark current of a phototransistor and shadowing by a base electrode, and an increase of an occupied area of an entire photoelectric conversion device is also provided.

Some of those specific structures are provided in a described (6) and (7).

(1)

A reset method of a photoelectric conversion device at least including a phototransistor having a first collector, a first base, and a first emitter, and a first field-effect transistor having a first source, a first drain, and a first gate includes: connecting the first base and one of the first source and the first drain of the first field-effect transistor by having a common region, or a continuous region, without a base electrode; supplying a base reset potential to the other of the first source and the first drain; and overlapping a time in which a first emitter potential is supplied to the first emitter and a time in which a first ON-potential that turns on the first field-effect transistor is supplied to the first gate.

The base rest potential can have an optimum value for a given application; however, in order to maximally secure sensitivity, a preferable base reset potential is as follows.

(2)

The reset method of the photoelectric conversion device according to (1), wherein the base reset potential is a value in which a base-emitter reset voltage of the phototransistor is added to the first emitter potential, and the base-emitter reset voltage is a base-emitter voltage of the phototransistor when a base-collector dark current of the phototransistor flows to the base and emitter of the phototransistor, or a voltage of less than or equal to ±kT/q of the base-emitter voltage, and here, k denotes Boltzmann constant, T denotes an absolute temperature of the photoelectric conversion device, and q denotes elementary charge of an electron.

The base-emitter voltage will be usually used through an unity gain voltage amplifier or a buffer amplifier to improve drivability.

(3)

The reset method of the photoelectric conversion device according to (1), wherein the first emitter potential is a reference potential that is supplied at the time of reading out.

The accumulation charge by light can he read out from the collector or the emitter of the phototransistor as an amplified charge, or a charging and discharging current. A potential that is supplied to the emitter at the time of reading out is called a reference potential in an embodiment of the present invention.

When a second base of a second transistor is connected to the emitter of the phototransistor, the reference potential is supplied to a second emitter of the second transistor, and additionally when a third base of a third transistor is connected to the second emitter of the second transistor, the reference potential is supplied to a third emitter of the third transistor. At this time, the accumulation charge by light or the photocurrent is read out as a further amplified charge, or charging and discharging current, from the second or third emitter of the second or third transistor. Also in this case, it is possible to read out the accumulation charge by light or the photocurrent also from the first collector of the phototransistor.

(4)

The reset method of the photoelectric conversion device according to (1), further including: providing the phototransistor with a second transistor (1200) having a second base (1022) and a second emitter (1023); connecting the first emitter of the phototransistor to the second base of the second transistor; and obtaining the first emitter potential by supplying a reference potential to the second emitter.

(5)

The reset method of the photoelectric conversion device according to (4), further including: providing the phototransistor with a third transistor (1300) having a third base (1032) and a third emitter (1033); connecting the second emitter of the second transistor to the third base of the third transistor; and obtaining the first emitter potential by supplying a reference potential to the third emitter.

Note that in cases of (4) and (5), in order to maximally secure sensitivity, the first emitter potential preferably has the following values. In a case of connecting the second transistor, a sum of the reference potential and the second base-emitter voltage when the base-collector dark current of the phototransistor is amplified by the phototransistor, and flow through the second base and the second emitter of the second transistor is the first emitter potential. In a case of additionally connecting the third transistor, a third base-emitter voltage when the amplified dark current is further amplified by the second transistor, and flows through the third base and third emitter of the third transistor is further added to the above sum, and it becomes the prescribed emitter potential.

An example of a construction in which the first base, and one of the first source and the first drain of the first field-effect transistor are connected by having a common area, or a continuous area (later-described second semiconductor region) without a base electrode will be described as follows.

(6)

A photoelectric conversion device including a first semiconductor region of a first conductivity type; a second semiconductor region of an opposite conductivity type opposite to the first conductivity that is in contact with the first semiconductor region; a third semiconductor region of the opposite conductivity type that is separate from the second semiconductor region and in contact with the first semiconductor region; a fifth semiconductor region of the first conductivity type that is in contact with the second semiconductor region; a first insulating film that is provided on a surface of the first semiconductor region sandwiched between at least the second and third semiconductor regions; and a first gate that is provided so as to bridge between the second and third semiconductor regions on the first insulating film, wherein when light illuminates the second semiconductor region, or the first semiconductor region in the vicinity of the second semiconductor region, a photocurrent flows between the second semiconductor region and the first semiconductor region, and a time in which the first emitter potential is supplied to the fifth semiconductor region overlaps with a time in which a base reset potential is supplied to the third semiconductor region and a first gate potential that induces a channel or current path on the surface of the first semiconductor region between the second and third semiconductor regions under the first gate is supplied to the first gate.

(7)

A photoelectric conversion device includes a first semiconductor region of a first conductivity type; a second semiconductor region of an opposite conductivity type opposite to the first conductivity type that is in contact with the first semiconductor region; a third semiconductor region of the opposite conductivity type that is separate from the second semiconductor region and in contact with the first semiconductor region; a fourth semiconductor region of the opposite conductivity type that is continuous to the second semiconductor region and is separate from the third semiconductor region, a fifth semiconductor region of the first conductivity type that is in contact with the second semiconductor region; a first insulating film that is provided on a surface of the first semiconductor region sandwiched between at least the second and fourth semiconductor regions; and a first gate that is provided so as to bridge between the second and fourth semiconductor regions on the first insulating film, wherein when light illuminates the second semiconductor region, or the first semiconductor region in the vicinity of the second semiconductor region, a photocurrent flows between the second semiconductor region and the first semiconductor region, and a time in which the first emitter potential is supplied to the fifth semiconductor region overlaps with a time in which a base reset potential is supplied to the third semiconductor region and a first gate potential that induces a channel or current path on the surface of the first semiconductor region between the second and fourth semiconductor regions under the first gate is supplied to the first gate.

It should be noted that the forth semiconductor region can be regarded as a part of the second semiconductor region, because the forth semiconductor region is continuous to the second semiconductor region and of the same conductivity type.

(8)

The photoelectric conversion device according to (6), wherein the second semiconductor region is a first base of a phototransistor, and the fifth semiconductor region is a first emitter of the phototransistor, and the base reset potential is a value in which a base-emitter reset voltage of the phototransistor added to the first emitter potential, and the base-emitter reset voltage is one of a base-emitter voltage of the phototransistor when a base-collector dark current of the phototransistor flows to the base and the emitter of the phototransistor or a voltage within $\pm kT/q$ of the base-emitter voltage, and here, k denotes Boltzmann constant, T denotes an absolute temperature of the photoelectric conversion device, and q denotes elementary charge of an electron.

(9)

The photoelectric conversion device according to (6) or (7), wherein the first emitter voltage is a reference potential that is supplied at the time of reading out.

(10)

The photoelectric conversion device according to (6) or (7), further including: a sixth semiconductor region of the opposite conductivity type that is separate from the second semiconductor region, and in contact with the first semiconductor region; and a seventh semiconductor region of the first conductivity type that is in contact with the sixth semiconductor region; wherein the sixth semiconductor region is electrically connected to the fifth semiconductor region, and the first emitter potential is obtained by supplying a reference potential to the seventh semiconductor region.

(11)

The photoelectric n device according to (10), further including: an eighth semiconductor region of the opposite conductivity type that is separate from the second semiconductor region and the sixth semiconductor region, and is in contact with the first semiconductor region; and a ninth semiconductor region of the first conductivity type that is in contact with the eighth semiconductor region, wherein the eighth semiconductor region is electrically connected to the seventh semiconductor region, and the first emitter potential is obtained by supplying a reference potential to the ninth semiconductor region.

(12)

The photoelectric conversion device according to (6), (7), (10), or (11) further including: a 10th semiconductor region of the opposite conductivity type that is in contact with the first semiconductor region; an 11th semiconductor region of the opposite conductivity type that is in contact with the first semiconductor region, and is separate from the 10th semiconductor region; a second insulating film that is provided on the surface of the first semiconductor region sandwiched between at least the 10th and 11th semiconductor regions; and a-second gate that is provided so as to bridge between the 10th and 11th semiconductor regions on the second insulating film, wherein the 10th semiconductor region is connected to the fifth semiconductor region, or the seventh semiconductor region, or the ninth semiconductor region, and a reference potential is supplied to the 11th semiconductor region, and by a second ON-potential supplied to the second gate, a channel, or a current path is formed on the surface of the first semiconductor region between the 10th and 11th semiconductor regions, and the reference potential is supplied through the channel or the current path to the 10th semiconductor region, and as a result the first emitter potential is supplied to the fifth semiconductor region.

Regarding the base reset potential, it is preferable to make a sum of the first emitter potential of the phototransistor and a base-emitter voltage corresponding to a base dark current of the phototransistor or a voltage within $\pm kT/q$ of the base-emitter voltage. As a specific example according to (3), the first emitter potential is the reference potential, and in a case where the second transistor is provided as (4), the first emitter potential is supplied from the second emitter potential (reference potential as a specific example), and in a case where the third transistor is provided as (5), the first emitter potential is supplied from the third emitter potential (reference potential as a specific example).

Additionally, it is preferable that the base reset potential optimally follow a change in temperature of the photoelectric conversion device.

(13)

A base reset potential generator, at least including: a base reset phototransistor which has a similar structure and dimension as those of the phototransistor according to (1), and over which a light shield is provided, wherein the first emitter potential is supplied to an emitter of the base reset phototransistor, and a potential obtained from a base of the base reset phototransistor is set to be the base reset potential.

Note that "the similar structure and dimension as those of the phototransistor according to (1)" means that the structure and size with which a base-emitter voltage of the base reset phototransistor becomes the same base-emitter voltage as that of the phototransistor within the deviation of $\pm kT/q$, when an emitter current of the same area density is flowed.

(14)

The base reset potential generator according to (13), further including: a fourth transistor having a fourth base, and a fourth emitter; wherein the emitter of the base reset phototransistor is connected to the fourth base, and a reference potential is supplied to the fourth emitter, and the potential obtained from the base of the base reset phototransistor is set to be the base reset potential.

(15)

The base reset potential generator according to (14), further including: a fifth transistor having a fifth base, and a fifth emitter; wherein the fourth emitter of the fourth transistor is connected to the fifth base, and a reference potential is supplied to the fifth emitter, and the potential obtained by the base of the base reset potential phototransistor is set to be the base reset potential.

(13), (14), and (15) are used in the reset method of the photoelectric conversion device (1) to (3), (4), and (5), respectively. And (13), (14), and (15) are used as a base reset potential generator of the photoelectric conversion device according to (6) to (9), (10), and (11). Since normally the output impedance of this base reset potential generator is high, the base reset potential is supplied via a buffer circuit to the other of the first source and the first drain of the photoelectric conversion device according to (1), (3), (4), (5), (6), (7), (9), (10), and (11). A voltage gain of the buffer circuit is unity, and an allowable error of an offset voltage and the voltage gain of the buffer circuit is approximately kT/q in total. Note that the base reset phototransistor, the fourth transistor, and the fifth transistor are preferably made at the same time with the phototransistor on the same chip as that of the phototransistor.

In the following photoelectric conversion device, a switch circuit and interconnection for a reset function, although they result in the increase of an area of the photoelectric conversion device, are effectively utilized for the control of saturation.

(16)

A photoelectric conversion device at least including: a phototransistor having a first collector, a first base, and a first emitter; a first field-effect transistor having a first source, a first drain, and a first gate; wherein the first base and the first source of the first field-effect transistor are connected without a base electrode by having a common region, or a continuous region, and after a base reset potential is supplied to the first drain, a first emitter potential is supplied to the first emitter, and a first ON-potential that turns on the first field-effect transistor is supplied to the first gate, and then a saturation control potential is supplied to the first gate, and a first drain potential is supplied to the first drain.

The saturation control potential is a potential from the first collector potential of the phototransistor+a gate threshold voltage Vth of the first field-effect transistor to a reference potential, and an upper limit of an accumulation charge by light is larger if it is farther from the reference potential.

The first drain potential is a potential Vsink for drawing a photocurrent flowing from the base before an electric capacitance connected to the base of the phototransistor is excessively charged and discharged and a base-collector voltage of the phototransistor is deeply biased to a deep forward voltage, and a potential that locates from the first collector potential to the reference potential.

If the first emitter potential is specified as one example by a photoelectric conversion device architecture, the following grouping is done.

(17)

The photoelectric conversion device according to (16), wherein the first emitter potential is the reference potential.

(18)

The photoelectric conversion device according to (16), further including: a second transistor having a second base and a second emitter, wherein the first emitter of the phototransistor is connected to the second base of the second transistor, and the first emitter potential is obtained by supplying a reference potential to the second emitter.

(19)

The photoelectric conversion device according to (18), further including: a third transistor having a third base and a third emitter, wherein the second emitter of the second transistor is connected to the third base of the third transistor, and the first emitter potential is obtained by supplying a reference potential to the third emitter.

(20)

The photoelectric conversion device according to (16), further including: a second field-effect transistor having a second source, a second drain, and a second gate, wherein one of the second source and the second drain is connected to the first emitter of the phototransistor, and electronic information (of charge or current) is output from the other of the second source and the second drain by supplying a second ON-potential to the second gate.

(21)

The photoelectric conversion device according to (18), further including: a second field-effect transistor having a second source, a second drain, and a second gate, wherein one of the second source and the second drain is connected to the second emitter of the second transistor, and electronic information (of charge or current) is output from the other of the second source and the second drain by supplying a second ON-potential to the second gate.

(22)

The photoelectric conversion device according to (19), further including: a second field-effect transistor having a second source, a second drain, and a second gate, wherein one of the second source and the second drain is connected to the third emitter of the third transistor, and electronic information (of charge or current) is output from the other of the second source and the second drain by supplying a second ON-potential to the second gate.

(23)

A photoelectric conversion array, including: plurality of the photoelectric conversion devices arranged in first and second directions crossing each other according to (17), (18), or (19); a plurality of first interconnections that extends in the first direction; a plurality of second interconnections that extends in the second direction; a plurality of third interconnections that is connected to the first gate; and at least one forth interconnection that is connected to the first drain, wherein the first, second, third, and fourth interconnections are insulated each other, and the collector of the phototransistor is connected to one of the plurality of the first interconnections that extends in the first direction, and in a case of the photoelectric conversion device according to (17) the first emitter of the phototransistor is connected to one of the plurality of the second interconnections that extends in the second direction, and in a case of the photoelectric conversion device according to (18) the second emitter of the second transistor is connected to one of the plurality of the second interconnections that extends in the second direction, and in a case of the photoelectric conversion device according to (19) the third emitter of the third transistor is connected to one of the plurality of the second interconnections that extends in the second direction.

(24)

A photoelectric conversion array, including: a plurality of the photoelectric conversion devices arranged in first and second directions crossing each other according to (20), (21), or (22); a plurality of first interconnections that extends in the first direction; a plurality of second interconnections that extends in the second direction; a plurality of third interconnections that is connected to the first gate; and at least one forth interconnection that is connected to the first drain, wherein the first, second, third, and fourth interconnections are insulated each other, and the second gate of the second field-effect transistor is connected to one of the plurality of the first interconnections that extends in the first direction, and the other of the second source and the second drain of the second field-effect transistor is connected to the plurality of the second interconnections that extends in the second direction.

(25)

An imaging device, including: the photoelectric conversion array according to (23), or (24); a Y-scan circuit that scans the first interconnections; plurality of current or charge sense circuits that are connected to the second interconnections; plurality of reference potential setting field-effect transistors, each having a source and a drain, and one of which is connected to one of the second interconnections; a reference potential supplier that is connected to the other of the source and the drain of each of the reference potential setting field-effect transistor; a reset and saturation control scan circuit that is connected to the third interconnections; and a first drain potential supplier that is connected to the fourth interconnection, wherein the current or charge sense circuit is a differential type having a reference potential input terminal in addition to a signal input terminal, and the reference potential is supplied to the reference potential input terminal.

Here, the Y-scan circuit sequentially supplies a pulse that is sent to the second gate of the second field-effect transistor connected by the first interconnections in the first direction, and is changed from the second OFF-potential to the second ON-potential and further to the second OFF-potential to the first interconnections disposed in the second direction (Y-direction).

The reset and saturation control scan circuit is synchronized with the Y-scan circuit, and sequentially supplies a pulse that is sent to the first gate of the first field-effect transistor connected by the third interconnections, and is changed from a saturation control potential to the first On-potential and further to the saturation control potential to the third interconnections arranged in the second direction.

The second OFF-potential is a second gate potential that turns off the second field-effect transistor when potentials of the second source and the second drain of the second field-effect transistor are at arbitrary potentials in a cell. The second ON-potential is constitutionally defined by (12); however, more generally when potentials of the second source or the second drain of the second field-effect transistor is at reference potential Vref, the second ON-potential is a second gate potential that turns on the second field-effect transistor. The first ON-potential is a first gate potential that turns on the first field-effect transistor when potentials of the first source and the first drain of the first field-effect transistor are at base reset potentials Vres. The saturation control potential is a potential that is supplied to clamp the base potential before a base-collector junction is deeply forward biased by a potential between a potential in which a gate threshold potential Vth of the first field-effect transistor is added to a first collector potential Vc1 of the phototransistor and the base rest potential Vres.

With reference to he drawings, an embodiment of the present invention will be explained further in detail.

In an embodiment of the present invention, as a method of supplying a base reset potential to a base of a phototransistor without a base electrode of the phototransistor, one of a source and a drain of a field-effect transistor and the base of the phototransistor have common region, or one of a source region and a drain region of the field-effect transistor and a base region of the phototransistor are continued. An example of this structure is illustrated in FIG. 1.

Figure 1:
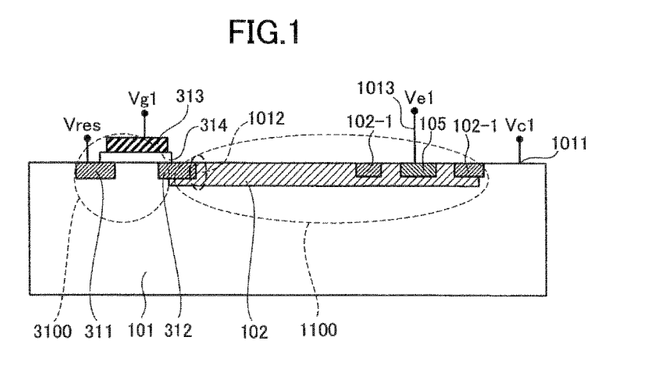
FIG. 1 is a cross-sectional diagram illustrating a structure example of a photoelectric conversion device according to an embodiment of the present invention where a first base phototransistor, and a first source or a first drain of a first field effect transistor are connected without a base electrode.

In FIG. 1, reference numeral 101 denotes a first semiconductor region of a first conductivity type, reference numeral 102 denotes a second semiconductor region of an opposite conductivity type opposite to the first conductivity type which is provided in contact with a surface of the first semiconductor region, and reference numeral 105 denotes a fifth semiconductor region of the first conductivity type which is provided in contact with the second semiconductor region. A part of the first semiconductor region 101 as a collector, the second semiconductor region 102 as a base, and the fifth semiconductor region 105 as an emitter form a phototransistor 1100. Reference numeral 102-1 denotes a 2-1 semiconductor region of the opposite conductivity type of which surface impurity concentration is larger than that of the second semiconductor region 102, and the 2-1 semiconductor region 102-1 is provided for prevention of surface leakage from the emitter 105 to the collector 101, and reduction of dependence on a current value of a current amplification factor.

Reference numerals 311 and 312 denote third and fourth semiconductor regions of the opposite conductivity type, respectively, which are provided in contact with the first semiconductor region 101, and are separate from each other. Reference numeral 314 denotes a first gate insulating film which is provided on a surface of the first semiconductor region 101 sandwiched between the third semiconductor region 311 and the fourth semiconductor region 312. In this example, the first gate insulating film 314 is also provided on a surface of edge parts of the third semiconductor region 311 and the fourth semiconductor region 312. Reference numeral 313 denotes a first gate that is provided on the first gate insulating film 314.

By an electric potential of the first gate 313, a channel or a current path is induced on the surface of the first semiconductor region 101 between the third semiconductor region 311 and the fourth semiconductor region 312, and it is electrically-conductive between the third semiconductor region 311 and the fourth semiconductor region 312. Regarding this gate potential, a gate-source voltage which starts substantial conduction, that is, a gate threshold voltage Vth1 can be defined.

The third semiconductor region 311, the fourth semiconductor region 312, the surface of the first semiconductor region 101 in the vicinity of the third semiconductor region 311 and the fourth semiconductor region 312, the first gate insulating film 314, and the first gate 313 constitute a first field-effect transistor 3100.

In the drawing, it is illustrated that the fourth semiconductor region 312 and the second semiconductor region 102 are overlapped, or continued, and the above two regions are electrically connected because of the same conductivity type. Additionally, in a case where the second semiconductor region 102 extends under the first gate 313, without the fourth semiconductor region 312, it is possible to constitute the first field-effect transistor 3100 as a form that is connected to the base of the phototransistor 1100 by sharing the second semiconductor region 102 of the phototransistor 1100.

Furthermore, the fourth semiconductor region 312 and the second semiconductor region 102 are of the same conductivity type, and can be grasped overall as one common region.

Figure 2:
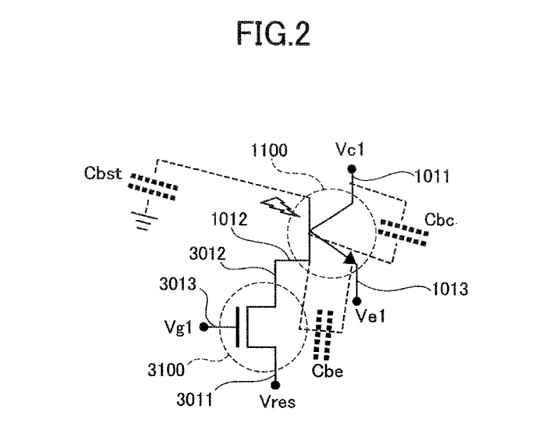
FIG. 2 is an equivalent circuit of the photoelectric conversion device according to an embodiment of the present invention.

FIG. 2 is an example of a circuit diagram of the above structure, and also an example of a photoelectric conversion device performing a method according to the above-described (1).

Reference numerals 1011, 1012, and 1013 denote a first collector, a first base, and a first emitter of a phototransistor 1100, respectively. Reference numerals 3011, 3012, and 3013 are a drain, a source, and a gate of a first field-effect transistor 3100, respectively. One of the first drain 3011 and the first source 3012 can be connected to the base 1012 without a base electrode; however, in the case of FIG. 2, the first source 3012 of the first field-effect transistor 3100 is continuously connected to the first base 1012.

In FIG. 2, a first emitter potential Ve1 is applied to the first emitter 1013 of the phototransistor 1100. A reset potential Vres is supplied to the first drain 3011 of the first field-effect transistor 3100. When a potential Vg1 of the gate 3013 is changed to a first ON-potential that turns on the first field-effect transistor 3100, a base-emitter voltage is reset to Vres−Ve1 (the reset potential−the first emitter potential). At this time, a base-collector capacitance Cbc is charged to Vc1−

Vres (the reset potential). Reference sign Vc1 denotes a collector potential of the first collector 1011 at the time of resetting.

When the potential Vg1 of the first gate 3013 is changed to a potential hat turns off the first field-effect transistor 3100, and the first emitter 1013 is in a floating state, for example, in a case where Vres−Ve1 is the base-emitter voltage corresponding to a dark current of the phototransistor 1100, the base-collector capacitance Cbc is started discharging by a photocurrent flowing from the first base 1012, and the voltage is changed by ΔV from the time of resetting. Cbc (base-collector capacitance)×ΔV is an electric quantity that is close to the accumulation charge by light defined in an embodiment of the present invention. Actually, a charge charged to a base floating capacitance, and a charge charged to the base-emitter capacitance are also included in the accumulation charge by light; however, they are usually relatively small and complicated, and therefore not mentioned here.

When the accumulation charge by light is read out, the first emitter 1013 of the phototransistor 1100 is fixed to a potential of the emitter potential Ve1 from the floating state, and a collector current or a charge for this accumulation time is read out, or a differential current sense amplifier, or a differential charge sense amplifier is connected to the first emitter 1013, a reference potential Vref is supplied to a reference input terminal of a differential input, and it is read out. At this time, the first emitter 1013 is read out at a potential of the reference potential Vref. The read-out electric charge is amplified by $h_{FE}$ times (in a case of reading out from the first collector 1011), and ($h_{FE}+1$) times (in a case of reading out from the first emitter 1013) of the accumulation charge by light and obtained. Note that $h_{FE}$ is a current amplification factor of the phototransistor 1100.

Figure 4:
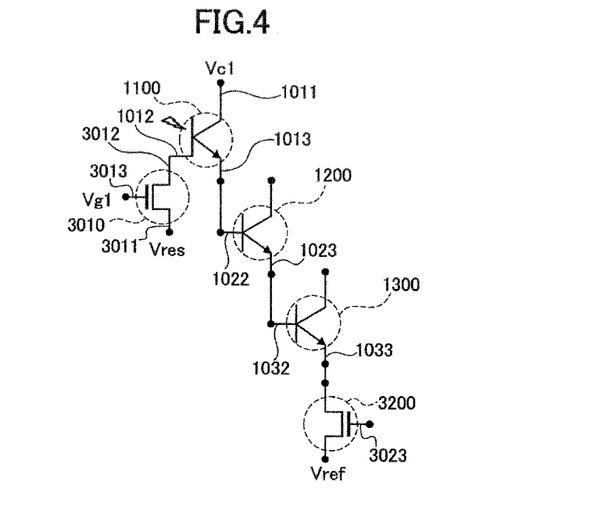
FIG. 4 is an equivalent circuit diagram according to another embodiment of the present invention.

In order to further increase the current amplification factor, as shown in FIG. 4, the second transistor 1200 having a second base 1022, and a second emitter 1023 is further provided to the above-described phototransistor circuit illustrated in FIG. 2, and the first emitter 1013 of the phototransistor 1100 is connected to the second base 1022, and output can be obtained from the second emitter 1023 or the first collector 1011 or a second collector of the second transistor 1200. And additionally, the third transistor 1300 having a third base 1032 and a third emitter 1033 is still further provided, and the second emitter 1023 is connected to the third base 1032, and output can be obtained from the third emitter 1033 or the first collector 1011, or the second collector of the second transistor 1012, or a third collector of the third transistor.

In order to make the first emitter of phototransistor, or the second emitter, or the third emitter of the second and third transistors in a floating state, the second field-effect transistor 3200 having a second source, a second drain, and a second gate 3023 is further provided with one of the second source and the second drain being connected to the first emitter of the phototransistor, or the second emitter, or the third emitter, and a reference potential is supplied to the other of the second source and the second drain, and then a change in potential (to a second OFF-potential that changes the second field-effect transistor 3200 to he turned off from on is given to the second gate 3023.

FIG. 4 illustrates an circuit diagram according to another embodiment where the above-described phototransistor circuit illustrated in FIG. 2 is further provided with a second transistor 1200, a third transistor 1300, and a second field-effect transistor 3200. Assuming when the differential current sense amplifier or the differential potential sense amplifier 9200 is used, a potential of the third emitter 1023 is set to he the reference potential Vref. As described later, in an actual imaging device, the reference potential Vref is given in a pulse state by switching of a field-effect transistor or the like before and after sensing.

As a method of setting the first base 1012 of the phototransistor 1100 to be in the floating state without using the second field-effect transistor 3200, a method of setting the potential of the first collector 1011 of the phototransistor 1100 to be a potential in a vicinity of the first emitter potential after finishing resetting or a potential Vc2 a direction of which is opposite to the collector potential Vc1 with reference to the first emitter potential after finishing resetting is applicable to an embodiment of the present invention.

Even if a later-described saturation control method circuit is used, capacitance of the base 1012 is discharged, and the base potential is changed to the potential Vc2, it is possible to stop a change in potential of the base 1012 at a designed value, and therefore without deeply biasing the base-collector junction to a deep forward voltage, until supplying the collector potential Vc1, a potential for reading out (can be the same as that at the time of resetting), to the first collector 1011, current does not flow from the first collector 1011 or the first emitter 1013.

When each cell that constitutes the array is selectively read out, the collector potential Vc1 of the phototransistor 1100 is usable for a cell selection, and therefore this characteristic is convenient.

The first field-effect transistor 3100 used for setting the base reset potential is usable for the saturation control of the phototransistor 1100.

In FIG. 2, the first emitter 1013 of the phototransistor 1100 is in the floating state after finishing a reset operation. A base potential Vb immediately after resetting is the reset potential Vres. The base-collector capacitance Cbc (junction capacitance is majority) is charged to a voltage of a difference between the collector potential Vc1 and the base reset potential. Base-ground capacitance Cbst is charged with only the base potential. Base-emitter capacitance Cbe is charged with only base-emitter voltage.

Along with an elapse of an accumulation time tstr, by the photocurrent the base-collector capacitance Cbc is discharged, the base-ground capacitance Cbst is further charged, and the base potential Vb is changed to a direction of the collector potential Vc1 from the reset potential Vres. Note that the base-emitter capacitance Cbe is charged and discharged for only a change (small) of the base-emitter voltage.

If it remains untouched, voltage of the base-collector junction is changed to reverse bias, and zero bias, the base potential passes over the collector potential Vc1, the voltage of the base-collector junction is changed to a forward bias, and at last deeply biased to a deep forward voltage, and the change in potential is stopped. Therefore, as described above, excess minority carriers are stored, which causes negative effects such as a switching speed delay, an image blur, and so on.

A stored amount of the excess minority carriers is approximately proportional to a forward current flowing through the base-collector junction. It is preferable to make the excess minority carriers zero; however, it is still sufficiently effective that the forward current flowing through the base-collector junction be suppressed to less than or equal to approximately $\frac{1}{10}$ of a photocurrent iph. That is, if the base-collector junction is forward-biased, a forward voltage only has to be controlled to be smaller by equal to or more than approximately 60 mV than the deep forward voltage that is deeply forward-biased. It is considered too perfect that a base-collector junction voltage Vbc is controlled to be a reverse bias voltage or zero volt.

When the base-collector junction is forward-biased, the forward voltage is controlled to be smaller by equal to or more than approximately 60 mV than the deep forward voltage that is deeply forward-biased, or the base-collector junction voltage Vbc is controlled to be the reverse bias voltage or zero volt, which is called "saturation control is performed" in an embodiment of the present invention.

Next, with reference to FIG. 3, a method of performing the saturation control using the first field-effect transistor 3100 prepared for a reset potential setting will be explained. In order to simplify an explanation, a case is assumed where a phototransistor is a NPN type, and a field-effect transistor is a P-channel type. After a reset operation, a first gate potential Vg1 is set to be a saturation control potential Vsctr1, and a case where the saturation control voltage Vsetr1 is set to be "Vc1+Vth" will be described. Since Vth, which is a gate threshold voltage of the first field-effect transistor 3100, is usually a negative voltage for the p-channel field-effect transistor, the saturation control voltage Vsctr1 is a potential that is on a side of the reset potential Vres from the collector potential Vc1 by |Vth|. When the first base 1012 is discharged by the photocurrent, and a base potential Vb is closer to a direction of the collector potential Vc1 from the reset potential Vres, the first field-effect transistor 3100 is turned on, and starts bypassing the photocurrent from the first source 3012 to the first drain 3011, because the first base 1012 and the first source 3012 are continuous, or have the common region, and are the same potentials. Therefore, the first base potential Vb does not become a positive potential larger than the collector potential Vc1. That is, since a potential of the first collector 1011 of the phototransistor 1100 is Vc1, the base-collector voltage Vbc of the phototransistor 1100 by calculating "Vb−Vc1" is not deeply biased into the deep forward voltage. At this time, to the first drain 3011, the collector potential Vc1, or a sink potential Vsink on a side of the reset potential Vres from the collector potential Vc1 is supplied.

In order to make the first base 1012 of the phototransistor 1100 in the floating state, in the above-described method of driving the collector potential Vc1 of the phototransistor 1100 is made to the potential Vc2, and the saturation control potential Vsctr1 that is supplied to the first gate 3013 of the first field-effect transistor 3100 is "Vc2+Vth", or a potential that is farther than "Vc2+Vth" from the collector potential Vc1. The sink potential Vsink is also a potential further than the potential Vc2 from the collector potential Vc1.

When this method is adopted, it is necessary to change a potential of the first gate 3013 of the first field-effect transistor 3100 to be closer to the collector potential Vc1 immediately before reading out.

In another method of making the first base 1012 of the phototransistor 1100 to be in the floating state, a potential that reverse-biases the first emitter 1013 of the phototransistor 1100 is applied to the first emitter 1013 to change the first emitter potential Ve1 to a direction of the collector potential Vc1. In this method, in a case where the second and the third transistors 1200, 1300 are included in the photoelectric conversion device, a potential that reverse biases the second emitter 1023 or the third emitter 1033 is applied to the second emitter 1023 or the third emitter 1033. In such a potential state, the first emitter 1013 of the phototransistor 1100 is in the floating state; therefore, light charge accumulation is started.

When the gate threshold voltage Vth of the first field-effect transistor 3100 is defined as a gate-source voltage that makes a saturation current flow (a threshold current, Ith) of 1 µA, for example, between the first source 3012 and the first drain 3011, and if a phototransistor has a light-receiving area which is less than or equal to 50 µm square, the base-collector voltage is clamped in the vicinity of 0 V even under the outside light in the daytime.

Figure 3:
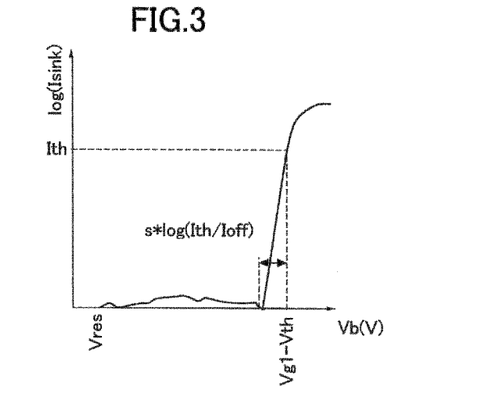
FIG. 3 is an explanation diagram of saturation control.

As illustrated in FIG. 3, when the first base potential Vb is close to "Vsctr1−Vth" from the reset potential Vres, a current Isink that is bypassed by the first field-effect transistor 3100 increases exponentially, and becomes Ith (for example, 1 µA) at "Vsctr1−Vth". A value of a so-called OFF-current Ioff can be designed at a pA level; therefore, current added to an equivalent dark current of the base-collector junction is small compared to when a Schottky diode is connected in parallel. While the base potential Vb is changed to "Vsctr1−Vth" from "Vsctr1−Vth−(0.4-0.5)V", the current Isink increases from a level of the OFF-current Ioff to Ith, the threshold current. This variation width of the base voltage Vb 0.4-0.5 V is given by "s×log (Ith/Ioff)". Here, s is a device parameter called a so-called sub-threshold slope.

In order to limit the base-collector voltage in a reverse bias range, it is only necessary to set the first gate potential Vg1 to be on a side of the reset potential Vres from "Vc1+Vth". In order to perform the saturation control on the photocurrent iph in a case where the light-receiving area of the phototransistor 1100 is larger than 50 µm square, and receives direct sunlight of midsummer, the same setting of the first gate potential Vg1, and setting of a channel width of the first field-effect transistor 3100 to a following width W that flows the photocurrent are performed. That is, when the photocurrent iph is larger than the threshold current Ith, and as Vg1<"Vc1+Vth", $$W=(iph-ith)\times 2L/(\mu Cox(Vsctr1-Vc1-Vth)^2)$$

Here, L is a channel length, µ is carrier mobility, Cox is a gate insulating film unit area capacitance. The threshold current Ith in this case uses a value ith per unit channel (W/L=1).

In the above explanation, a potential magnitude relationship and polarity have been explained as an example of the case where the first field-effect transistor is the P-channel type; however, in a case where a field-effect transistor is a N-channel type, a magnitude relationship and polarity are opposite to the above.

For developing the photoelectric conversion device according to an embodiment of the present invention in an array manner, as illustrated in FIG. 4, an example of a case where a photoelectric conversion device having the first field-effect transistor 1100 and the second field-effect transistor 1200 is taken as a unit cell will be explained. In FIG. 4, the second transistor and the third transistor are included; however, a case without the third transistor, and a case without the second transistor are the same.

Figure 5:
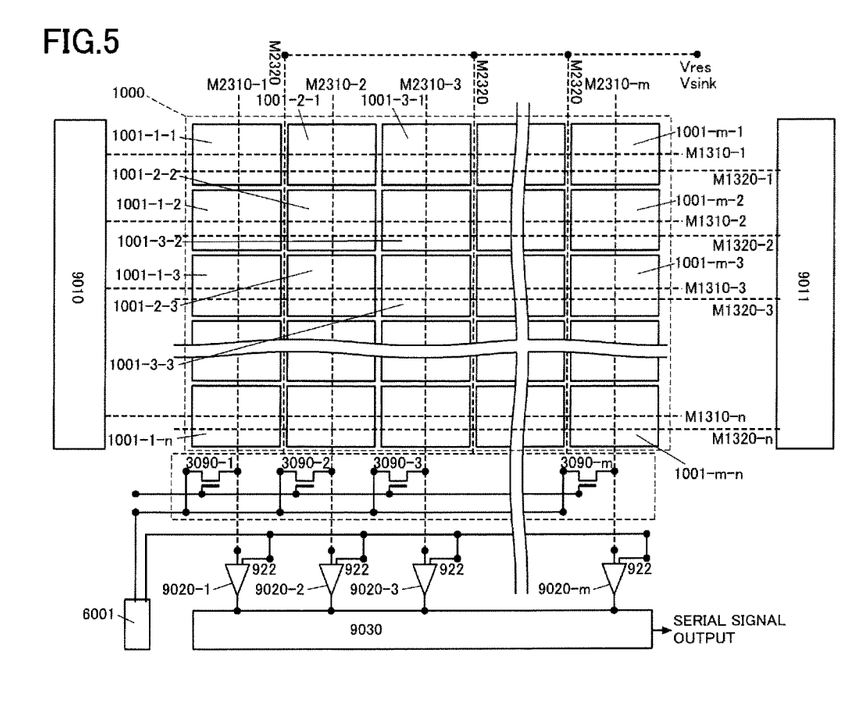
FIG. 5 is a circuit block diagram of an imaging device using an array according to an embodiment of the present invention.

An architecture of an array denoted by reference numeral 1000 in FIG. 5 is as follows. That is, the photoelectric conversion device illustrated in FIG. 4 is taken as a unit cell 1001-$i$-$j$ (i=1, 2, 3, ..., m, j=1, 2, 3, ..., n), and a plurality of the cells are arranged in first and second directions which cross each other.

A plurality of first interconnections M1310-$j$ (j=1, 2, 3, ..., n) that extends in the first direction, a plurality of second interconnections M2310-$i$ (i=1, 2, 3, ..., m) that extends in the second direction, a plurality of third interconnections M1320-$j$ (j=1, 2, 3, ..., n) that supplies the first gate potential, and at least one fourth interconnection M2320 that supplies the first drain potential are insulated each other and arranged.

The second gate 3023 of the second field-effect transistor 3200 of the unit cell arranged in the first direction is connected to one of the plurality of the first interconnections M1310-$j$ (j=1, 2, 3, ..., n) that extends in the first direction, one of a first source and a first drain of the first field-effect transistor 3100 is connected to the first emitter of the phototransistor, or to the second emitter of the second transistor or to the third emitter of the third transistor, respectively, and the other of the second source and the second drain of the second field-effect transistor 3200 of the unit cell arranged in the second direction is connected to one of the plurality of the second interconnections M2310-$i$ ($i$=1, 2, 3, . . . , m) that extends in the second direction, and the gate 3013 of the first field-effect transistor 3100 of the unit cell arranged in the first direction is connected to one of the plurality of the third interconnections M1320-$j$ ($j$=1, 2, 3, . . . , n) that extends in the first direction.

As an example of an imaging device using an embodiment of the present invention, an architecture illustrated in FIG. 5 including the above-described array 1000, a Y-scan circuit 9010 that scans the first interconnections M1310-$j$ ($j$=1, 2, 3, . . . , n) that extend in the first direction, a current or charge sense circuit 9020-$i$ ($i$=1, 2, 3, . . . , m) (assuming a case of a plurality of circuits. In a case of a single circuit, it is connected via switching field-effect transistors.) connected to the second interconnections M2310-$i$ ($i$=1, 2, 3, . . . , m) that extend in the second direction, and a reference potential setting field-effect transistor 3090-$i$ ($i$=1, 2, 3, . . . , m) (assuming a case of a plurality of circuits. In a case of a single circuit, it is connected via switching field-effect transistors.) is provided. The current or charge sense circuit 9020-$i$ is a differential type having a potential input terminal 922.

The reference potential Vref is supplied to the reference potential input terminal 922 of the sense circuit 9020-$i$ from a reference potentia provider 6001.

One of a source or a drain of the reference potential setting field-effect transistor 3090-$i$ is connected to output lines (second interconnections) M2310-$i$ ($i$=1, 2, 3, . . . m), and to the other of the source or the drain of the reference potential setting field-effect transistor 3090-$i$ the reference potential Vref is supplied from the reference potential provider 6001.

Output of the sense circuit 9020-$i$ is converted into a serial signal by a parallel-serial conversion circuit 9030.

A reset base potential Vres is supplied to the fourth interconnection M2320, and immediately after sensing a cell connected to the selected first interconnections, a potential (second ON-potential) that turns on the first field-effect transistor from off is applied from a reset and saturation control scan circuit 9011 (from FIG. 5), and a cell connected to the third interconnections is reset. At this time, also to the first interconnections to which the cell is connected, the second ON-potential that turns on the second field-effect transistor is applied from the Y-scan circuit 9020, and to the second interconnections, the reference potential Vref is supplied via the reference potential setting field-effect circuit 3090-$i$, and not only a base potential of the cell but also a base-emitter potential is reset.

The each output line (second interconnection) is charged to the reference potential Vref by the reference potential setting field-effect transistor 3090-$i$ when each second field-effect transistor is turned off, after sensing, and then after resetting, and before next sensing if necessary. To leading-out interconnections (third interconnections) M1320 of the first gate 3013 of the first field-effect transistor 3100 in the unit cell 1001-$i$-$j$ as the photoelectric conversion device illustrated in FIG. 4, from the reset and saturation control circuit 9011 (from FIG. 5), a saturation control potential is given by "Vc1+Vth", or a potential within a range from "Vc1+Vth" to the reset base potential. To leading-out lines (fourth interconnections) M2320 of the first drain 3011 of the first field-effect transistor 3100 for the reset and saturation control, the reset base potential Vres is applied (in a case of meeting a condition of Vsink replacement). Thus, saturation control during charge accumulation or discharge of Cbc by the photoelectric current is performed. Thus, both the base-emitter voltage reset and the saturation control are achieved.

An embodiment of the present invention is used for the purpose to widen a field of application of sensors, office equipment, and scientific instruments using photoelectric conversion. It is possible to achieve improvement of a residual image phenomenon of high-sensitivity photoelectric conversion devices and imaging devices with a minimal sacrifice of sensitivity, and in short, concurrently a switching delay and an image blur when using in circumstances where light intensity and illuminance are large is reduced, and a range of use is expanded.

According to an embodiment of the present invention, it is possible to perform reset of a base-emitter voltage of a phototransistor fast, and set an optimal value, without increasing a base dark current. Therefore, it is possible to achieve a photoelectric conversion device without a residual image and sensitivity loss. It is possible to prevent a reduction of conversion efficiency of the photoelectric conversion device due to a shadow effect of a base electrode, and reduce an occupied area more than ever. It is conducive to reduce a chip area when forming an array.

Additionally, it is possible to control storage of excess minority carriers in the phototransistor to be reduced; therefore, a switching delay of a photoelectric conversion device is small, and it is possible to expect speed-up of reading out.

Further, in a case where a plurality of cells including a photoelectric conversion device according to an embodiment of the present invention forms an array, it is possible to prevent leakage of a photocurrent from an adjacent cell, and therefore it is possible to prevent blurring of an image obtained by an imaging device using the array, and deterioration of an equivalent resolution.

Although the present invention has been described in terms of exemplary embodiments, it is not limited thereto. It should be appreciated that variations may be made in the embodiments described by persons skilled in the art without departing from the scope of the present invention as defined by the following claims.

What is claimed is:

1. A photoelectric conversion device comprising:
   a first semiconductor region of a first conductivity type;
   a second semiconductor region of an opposite conductivity type opposite to the first conductivity type that is in contact with the first semiconductor region;
   a third semiconductor region of the opposite conductivity type that is separate from the second semiconductor region, and is in contact with the first semiconductor region;
   a fifth semiconductor region of the first conductivity type that is in contact with the second semiconductor region;
   a first insulating film that is provide on at least a surface of the first semiconductor region sandwiched between at least the second and third semiconductor regions; and
   a first gate that is provided on the first insulating film across the second and third semiconductor regions,
   wherein the second semiconductor region, or the first semiconductor region in a vicinity of the second semiconductor region is illuminated by light, and a photocurrent flows between the second semiconductor region and the first semiconductor region, and a time in which a first emitter potential is supplied to the fifth semiconductor region overlaps with a time in which a base reset potential is supplied to the third semiconductor region and a first gate potential that induces a channel or a current path on the surface of the first semiconductor region between the second and third semiconductor regions under the first gate is supplied to the first gate.

2. The photoelectric conversion device according to claim 1, wherein the second semiconductor region is a first base of a phototransistor, and the fifth semiconductor region is a first emitter of the phototransistor, and the base reset potential is a value in which a base-emitter reset voltage of the phototransistor is added to the first emitter potential, and the base-emitter reset voltage is a base-emitter voltage of the phototransistor when a base-collector dark current of the phototransistor flows to the base and the emitter of the phototransistor or a voltage within $\pm KT/q$ of the base-emitter voltage, and here, K denotes Boltzmann constant, T denotes an absolute temperature of the photoelectric conversion device, and q denotes elementary charge of an electron.

3. The photoelectric conversion device according to claim 1, wherein the first emitter voltage is a reference potential that is supplied at the time of reading out.

4. The photoelectric conversion device according to claim 1, further comprising:
a sixth semiconductor region of the opposite conductivity type that is separate from the second semiconductor region, and is in contact with the first semiconductor region; and
a seventh semiconductor region of the first conductivity type that is in contact with the sixth semiconductor region;
wherein the sixth semiconductor region is electrically connected to the fifth semiconductor region, and the first emitter potential is obtained by supplying a reference potential to the seventh semiconductor region.

5. The photoelectric conversion device according to claim 4, further comprising:
an eighth semiconductor region of the opposite conductivity type that is separate from the second semiconductor region and the sixth semiconductor region, and is in contact with the first semiconductor region; and
a ninth semiconductor region of the first conductivity type that is in contact with the eighth semiconductor region,
wherein the eighth semiconductor region is electrically connected to the seventh semiconductor region, and the first emitter potential is obtained by supplying a reference potential to the ninth semiconductor region.

6. The photoelectric conversion device according to claim 1, further comprising:
a 10th semiconductor region of the opposite conductivity type that is in contact with the first semiconductor region;
an 11th semiconductor region of the opposite conductivity type that is in contact with the first semiconductor region, and is separate from the 10th semiconductor region;
a second insulating film that is provided on the surface of the first semiconductor region sandwiched between at least the 10th and 11th semiconductor regions; and
a second gate that is provided so as to bridge between the 10th and 11th semiconductor regions on the second insulating film,
wherein the 10th semiconductor region is connected to the fifth semiconductor region, and a reference potential is supplied to the 11th semiconductor region, and by a second ON-potential supplied to the second gate, a channel, or a current path is formed on the surface of the first semiconductor region between the 10th and 11th semiconductor regions, and the reference potential is supplied through the channel or the current path to the 10th semiconductor region, and as a result the first emitter potential is supplied to the fifth semiconductor region.

7. A photoelectric conversion device at least comprising:
a phototransistor having a first collector, a first base, and a first emitter;
a first field-effect transistor having a first source, a first drain, and a first gate;
wherein the first base and the first source of the first field-effect transistor are connected without a base electrode by having a common region, or a continuous region, and after a base reset potential is supplied to the first drain, a first emitter potential is supplied to the first emitter, and a first ON-potential that turns on the first field-effect transistor is supplied to the first gate, and then a saturation control potential is supplied to the first gate, and a first drain potential is supplied to the first drain.

8. The photoelectric conversion device according to claim 7, further comprising:
a second transistor having a second base, and a second emitter;
wherein the first emitter of the phototransistor is connected to the second base of the second transistor, and the first emitter potential is obtained by supplying a reference potential to the second emitter.

9. The photoelectric conversion device according to claim 8, further comprising:
a third transistor having a third base, and a third emitter;
wherein the second emitter of the second transistor is connected to the third base of the third transistor, and the first emitter potential is obtained by supplying a reference potential to the third emitter.

10. The photoelectric conversion device according to claim 7, further comprising:
a second field-effect transistor having a second source, a second drain, and a second gate;
wherein one of the second source and the second drain is connected to the first emitter of the phototransistor, and electronic information is output from the other of the second source and the second drain by supplying a second ON-potential to the second gate.

11. The photoelectric conversion device according to claim 8, further comprising:
a second field-effect transistor having a second source, a second drain, and a second gate;
wherein one of the second source and the second drain is connected to the second emitter of the second transistor, and electronic information is output from the other of the second source and the second drain by supplying a second ON-potential to the second gate.

12. The photoelectric conversion device according to claim 9, further comprising:
a second field-effect transistor having a second source, a second drain, and a second gate;
wherein one of the second source and the second drain is connected to the third emitter of the third transistor, and electronic information is output from the other of the second source and the second drain by supplying a second ON-potential to the second gate.

* * * * *